United States Patent
Choi

(10) Patent No.: US 8,040,298 B2
(45) Date of Patent: Oct. 18, 2011

(54) ORGANIC LIGHT EMITTING DIODE DISPLAY AND MANUFACTURING METHOD THEREOF

(75) Inventor: Joon-Hoo Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1043 days.

(21) Appl. No.: 11/621,723

(22) Filed: Jan. 10, 2007

(65) Prior Publication Data

US 2007/0159433 A1 Jul. 12, 2007

(30) Foreign Application Priority Data

Jan. 10, 2006 (KR) .................. 10-2006-0002698

(51) Int. Cl.
*G09G 3/30* (2006.01)
(52) U.S. Cl. ........................................ 345/76; 345/92
(58) Field of Classification Search .................. None
See application file for complete search history.

(56) References Cited

U.S. PATENT DOCUMENTS

| | | | |
|---|---|---|---|
| 6,348,906 B1 * | 2/2002 | Dawson et al. ........... | 345/82 |
| 6,501,227 B1 * | 12/2002 | Koyama ................. | 315/169.3 |
| 6,828,585 B2 * | 12/2004 | Ueda ..................... | 257/59 |
| 6,936,848 B2 | 8/2005 | Sun et al. | |
| 2002/0149320 A1 * | 10/2002 | Maruyama et al. ....... | 315/169.3 |
| 2003/0075733 A1 * | 4/2003 | Yamazaki et al. ........ | 257/200 |
| 2004/0056828 A1 * | 3/2004 | Choi et al. .............. | 345/82 |
| 2005/0030304 A1 * | 2/2005 | Inukai .................. | 345/204 |
| 2005/0190133 A1 * | 9/2005 | Kawachi ................ | 345/87 |
| 2005/0197031 A1 | 9/2005 | Yamazaki et al. | |
| 2005/0200618 A1 * | 9/2005 | Kim et al. .............. | 345/204 |
| 2005/0248513 A1 * | 11/2005 | Hu ...................... | 345/76 |

FOREIGN PATENT DOCUMENTS

| | | |
|---|---|---|
| JP | 06-151458 | 5/1994 |
| JP | 10-242052 | 9/1998 |
| JP | 2004-328016 | 11/2004 |
| JP | 2004-342923 | 12/2004 |
| JP | 2005-072531 | 3/2005 |
| JP | 2005-091646 | 4/2005 |
| KR | 1020020017229 | 3/2002 |
| KR | 1020030028109 | 4/2003 |
| KR | 1020030038835 | 5/2003 |
| KR | 1020050068187 | 7/2005 |

* cited by examiner

*Primary Examiner* — Alexander Eisen
*Assistant Examiner* — Matthew Yeung
(74) *Attorney, Agent, or Firm* — Cantor Colburn LLP

(57) ABSTRACT

An OLED display according to an exemplary embodiment of the present invention includes a substrate, a gate line formed on the substrate and including a first control electrode, a data line intersecting the gate line, a switching TFT connected to the gate line and the data line, a driving TFT connected to the switching TFT, a first electrode connected to the driving TFT, a second electrode facing the first electrode, and a light emitting member formed between the first electrode and the second electrode. At least one of the switching TFT and the driving TFT includes a plurality of channels.

20 Claims, 13 Drawing Sheets

ORGANIC LIGHT EMITTING DIODE DISPLAY AND MANUFACTURING METHOD THEREOF

This application claims priority to Korean Patent Application No. 10-2006-0002698, filed on Jan. 10, 2006, and all the benefits accruing therefrom under 35 U.S.C. §119, the contents of which in its entirety are herein incorporated by reference.

BACKGROUND OF THE INVENTION (a) Field of the Invention

The present invention relates to an organic light emitting diode ("OLED") display and a manufacturing method thereof, and more particularly, to an OLED having a switching thin film transistor ("TFT") and a driving thin film transistor ("TFT") in which one of the switching TFT and the driving TFT includes a plurality of channels display.

(b) Description of the Related Art

Recent trends toward lightweight and thin personal computers and televisions sets accordingly require lightweight and thin display devices. Flat panel displays satisfying such a requirement are being substituted for conventional cathode ray tubes ("CRTs").

The flat panel displays include a liquid crystal display ("LCD"), a field emission display ("FED"), an organic light emitting diode ("OLED") display, or a plasma display panel ("PDP"), among others. Among the flat panel displays, the OLED display is the most promising because of its low power consumption, fast response time, wide viewing angle and high contrast ratio.

An OLED display is a self-emissive display device which includes two electrodes and an organic light emitting layer interposed therebetween. One of the two electrodes injects holes and the other electrode injects electrons into the light emitting layer. The injected electrons and holes are combined to form exitons, which emit light as discharge energy.

The OLED displays may be divided into a passive matrix type OLED display and an active matrix type OLED display, based on a driving method thereof.

The passive matrix type OLED display includes a plurality of anode lines, a plurality of cathode lines intersecting the anode lines, and a plurality of pixels, each including a light emission layer. The selection of one of the anode lines and one of the cathode lines causes light emission of a pixel located at the intersection of the selected signal lines. In contrast, the active matrix type OLED display includes a plurality of pixels, each including a switching transistor, a driving transistor and a storage capacitor, as well as an anode, a cathode and a light emission layer. The driving transistor receives a data voltage from the switching transistor and drives a current having a magnitude determined by the data voltage. The current from the driving transistor enters the light emission layer to cause light emission having an intensity based on the driving current.

In the active matrix type OLED display, characteristics of the switching thin film transistor ("TFT") and those of the driving TFT may be different from each other to optimize the characteristics of the OLED. In more detail, the switching TFT may have a good on/off characteristic, and the driving TFT may have a high mobility and stability for supplying sufficient current for driving the OLED.

In the driving TFT, a polycrystalline semiconductor may be used for improving the mobility and stability of the driving TFT.

However, if the polycrystalline semiconductor is used in the switching TFT, then the on/off characteristic thereof may be deteriorated due to large leakage current of the polycrystalline semiconductor. Accordingly, the data voltage transported from the switching TFT to the driving TFT may be reduced to generate cross-talk.

BRIEF SUMMARY OF THE INVENTION

An OLED display according to an exemplary embodiment of the present invention includes a substrate; a gate line formed on the substrate and including a first control electrode; a data line intersecting the gate line; a switching TFT connected to the gate line and the data line; a driving TFT connected to the switching TFT; a first electrode connected to the driving TFT; a second electrode facing the first electrode; and a light emitting member formed between the first electrode and the second electrode. At least one of the switching TFT and the driving TFT includes a plurality of channels.

The switching TFT may include a polycrystalline semiconductor.

The driving TFT may include a polycrystalline semiconductor.

The OLED display may further include a secondary gate line substantially parallel to the gate line and including a secondary control electrode.

The secondary gate line may be supplied with a voltage different from that of the gate line.

The secondary gate line may be supplied with a positive voltage when the gate line is supplied with a gate-off voltage.

The secondary gate line may be floating when the gate line is supplied with a gate-off voltage.

The secondary control electrode may include a first secondary control electrode and a second secondary control electrode, and the first control electrode may be located between the first secondary control electrode and the second secondary control electrode.

Each interval between the first control electrode, and the first secondary control electrode and the second secondary control electrode, may be about 4 μm or less.

The channels may include a first channel formed on the first secondary control electrode, a second channel formed on the first control electrode and a third channel formed on the second secondary control electrode.

The first, second and third channels may be formed on a polycrystalline semiconductor.

The switching TFT may include a first switching TFT including the first secondary control electrode, a first input electrode connected to the data line, and a first output electrode facing the first input electrode; a second switching TFT including the first control electrode, a second input electrode connected to the first output electrode, and a second output electrode facing the second input electrode; and a third switching TFT including the second secondary control electrode, a third input electrode connected to the second output electrode, and a third output electrode facing the third input electrode.

The first switching TFT, the second switching TFT, and the third switching TFT may include a polycrystalline semiconductor.

An OLED display according to another exemplary embodiment of the present invention includes a substrate; a gate line formed on the substrate and including a first control electrode; a secondary gate line substantially parallel to the gate line; a secondary control electrode connected to the secondary gate line, and including a first portion and a second portion; a first semiconductor formed on the first control electrode and the secondary control electrode; a data line intersecting the gate line and the secondary gate line; a first input electrode connected to the data line, and partially overlapping the first semiconductor; a first input and output electrode partially overlapping the first portion of the secondary control electrode and the first control electrode, and including a portion facing the first input electrode; a second input and output electrode partially overlapping the second portion of the secondary control electrode, and including a portion facing the first input and output electrode; a first output electrode partially overlapping the second portion of the secondary control electrode, and including a portion facing the second input and output electrode; a second control electrode connected to the first output electrode; a second semiconductor formed on the second control electrode; a second input electrode and a second output electrode partially overlapping the second semiconductor; a first electrode connected to the second output electrode; a second electrode facing the first electrode; and a light emitting member formed between the first electrode and the second electrode.

The secondary control electrode may surround the first control electrode, and the first control electrode may be located between the first portion of the secondary control electrode and the second portion of the secondary control electrode.

The secondary control electrode and the first control electrode may be separated from each other at an interval of about 4 μm or narrower.

The first input electrode, the first input and output electrode, the second input and output electrode, and the first output electrode may be connected to each other by the first semiconductor.

The first semiconductor and the second semiconductor may include a polycrystalline semiconductor.

The secondary gate line may be supplied with a voltage different from that of the gate line.

The secondary gate line may be supplied with a positive voltage when the gate line is supplied with a gate-off voltage.

The secondary gate line may be floating when the gate line is supplied with a gate-off voltage.

A method of manufacturing an OLED display according to yet another exemplary embodiment of the present invention includes forming gate conductors including a gate line including a first control electrode, a secondary gate line including a secondary control electrode, and a second control electrode on a substrate; forming a gate insulating layer and a semiconductor layer on the gate conductors and the substrate; crystallizing the semiconductor layer; forming data conductors including a data line, a driving voltage line, a plurality of input electrodes, and a plurality of output electrodes on the crystallized semiconductor layer; forming a first electrode connected to one of the plurality of output electrodes; forming a light emitting member on the first electrode; and forming a second electrode on the light emitting member.

The crystallization of the semiconductor layer may be performed using solid phase crystallization.

An ohmic contact layer may be formed on the semiconductor layer simultaneously in the forming of the gate insulating layer and the semiconductor layer.

BRIEF DESCRIPTION OF THE DRAWINGS

The present invention will become more apparent by describing exemplary and preferred embodiments thereof in more detail with reference to the accompanying drawings, in which.

DETAILED DESCRIPTION OF THE INVENTION

Figure 1:
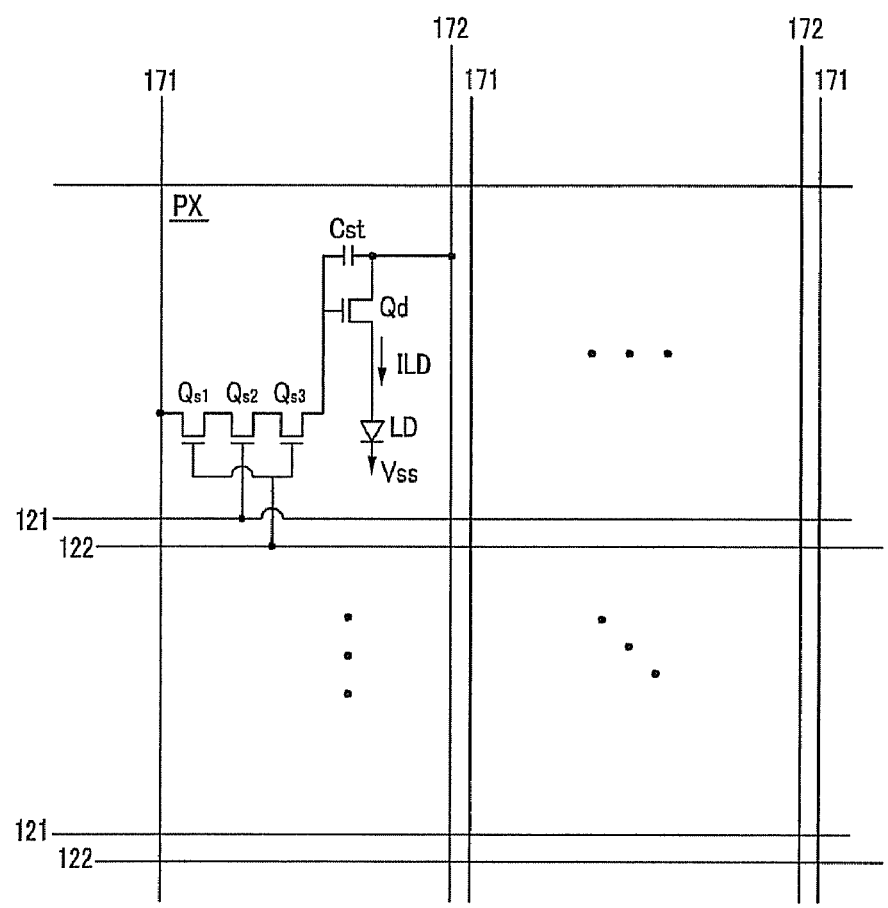
FIG. 1 an equivalent circuit schematic diagram of an OLED display according to an exemplary embodiment of the present invention.

The present invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the present invention. Rather, these exemplary embodiments are provided so that this disclosure will be thorough and complete, and will fully convey the scope of the present invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

First, an OLED display according to an exemplary embodiment of the present invention is described in more detail with reference to FIG. 1.

FIG. 1 is an equivalent circuit schematic diagram of an OLED display according to an exemplary embodiment of the present invention.

Referring to FIG. 1, an OLED display according to an exemplary embodiment of the present invention includes a plurality of signal lines 121, 122, 171 and 172, and a plurality of pixels PX connected thereto and arranged substantially in a matrix.

The signal lines include a plurality of gate lines 121 transmitting gate signals, a plurality of secondary gate lines 122 transmitting the same or different signals from the gate signals, a plurality of data lines 171 transmitting data signals, and a plurality of driving voltage lines 172 transmitting a driving voltage. The gate lines 121 and the secondary gate lines 122 extend substantially in a row direction and substantially parallel to each other, while the data lines 171 and the driving voltage lines 172 extend substantially in a column direction and substantially parallel to each other, as illustrated in FIG. 1.

Each pixel PX includes a first, a second and a third switching transistors Qs1, Qs2, and Qs3, respectively, a driving transistor Qd, a storage capacitor Cst and an organic light emitting diode LD.

The first, second and third switching transistors Qs1, Qs2, and Qs3 each respectively have a control terminal, an input terminal and an output terminal. The control terminal of the first switching transistor Qs1 is connected to the control terminal of the third switching TFT, the input terminal thereof is connected to the data line 171, and the output terminal thereof is connected to the second switching TFT Qs2. The control terminal of the second switching TFT Qs2 is connected to the gate line 121, the input terminal thereof is connected to the first switching TFT Qs1, and the output terminal thereof is connected to the third switching TFT Qs3. The control terminal of the third switching TFT Qs3 is connected to the secondary gate line 122, the input terminal thereof is connected to the second switching TFT Qs2, and the output terminal thereof is connected to the driving transistor Qd.

The switching transistors Qs1, Qs2 and Qs3 transmit the data signals applied to the data line 171 to the driving transistor Qd in response to the gate signals applied to the gate line 121 and secondary gate line 122.

The driving transistor Qd has a control terminal connected to the output terminal of third switching transistor Qs3, an input terminal connected to the driving voltage line 172, and an output terminal connected to the OLED LD. The driving transistor Qd drives an output current $I_{LD}$ having a magnitude dependent on the voltage between the control terminal and the output terminal of the driving transistor Qd.

The capacitor Cst is connected between the control terminal and the input terminal of the driving transistor Qd. The capacitor Cst stores the data signal applied to the control terminal of the driving transistor Qd and maintains the data signal after the switching transistor Qd turns off.

The OLED LD has an anode connected to the output terminal of the driving transistor Qd and a cathode connected to a common voltage Vss. The OLED LD emits light having an intensity depending on the output current $I_{LD}$ of the driving transistor Qd, thereby displaying images.

The switching transistors Qs1, Qs2, Qs3 and the driving transistor Qd are n-channel field effect transistors ("FETs"). However, at least one of the switching transistors Qs1, Qs2, Qs3, and the driving transistor Qd may be a p-channel FET. In addition, the connections among the transistors Qs1, Qs2, Qs3, Qd, the capacitor Cst, and the OLED LD may be modified.

A more detailed structure of the OLED display shown in FIG. 1 according to an exemplary embodiment of the present invention will be described in more detail with reference to FIGS. 2 and 3 along with FIG. 1.

Figure 2:
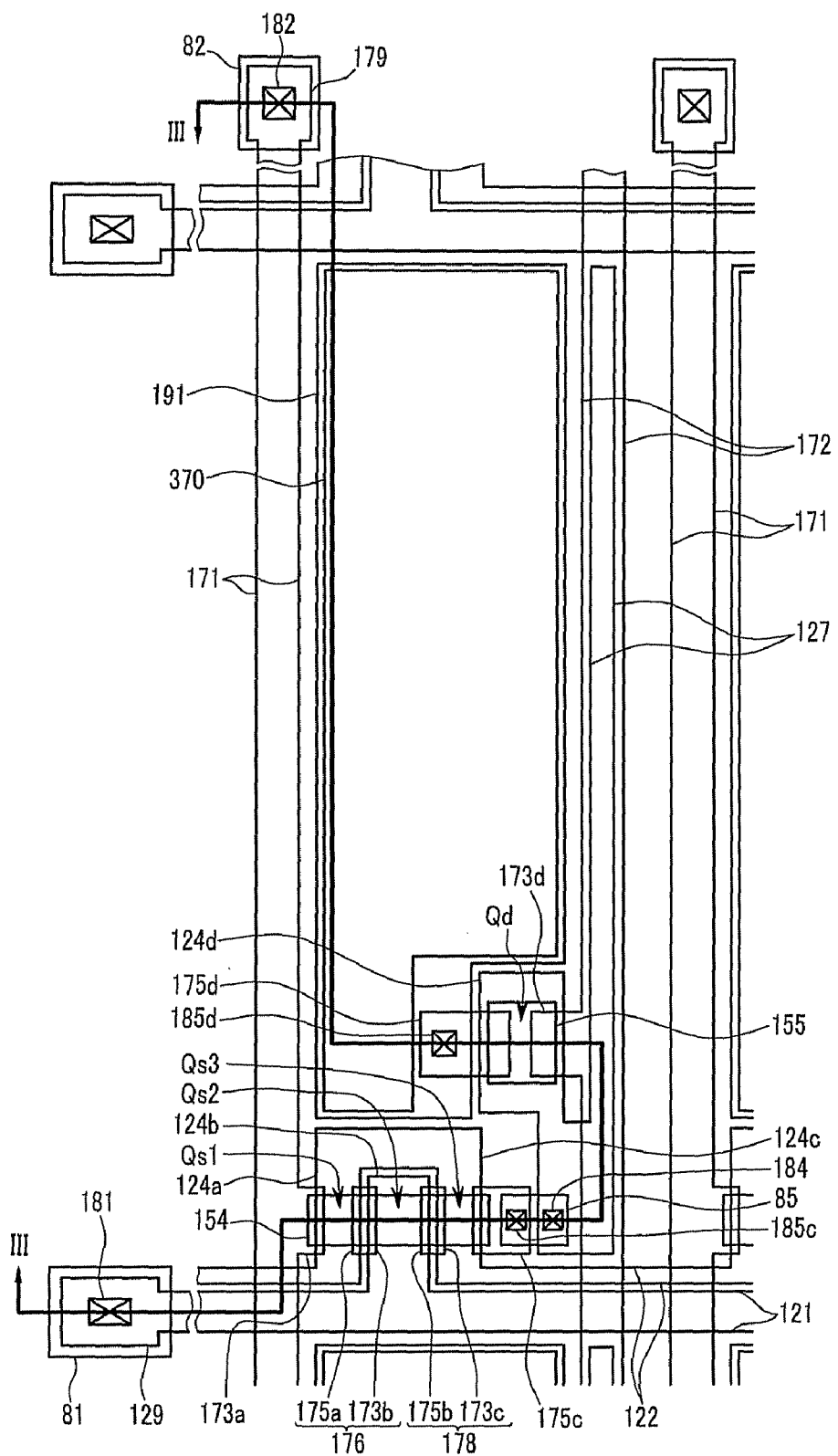
FIG. 2 is a plan view layout of an OLED display according to an exemplary embodiment of the present invention.

FIG. 2 is a plan view layout of an OLED display according to an exemplary embodiment of the present invention. FIG. 3 is a cross-sectional view of the OLED display shown in FIG. 2 taken along line III-III.

A plurality of gate conductors, which includes a plurality of gate lines 121 including a plurality of first control electrodes 124b, and a plurality of secondary gate lines 122 including a plurality of secondary control electrodes 124a and 124c and a plurality of second control electrodes 124d, are formed on an insulating substrate 110 made of a material such as transparent glass or plastic.

The gate lines 121 transmit gate signals and extend substantially in a transverse direction, as illustrated in FIGS. 1 and 2. Each gate line 121 further includes an end portion 129 having a large area for contact with another layer or an external driving circuit (not shown), and the first control electrode 124b projects upward from the gate line 121, as illustrated in FIG. 2. The gate lines 121 may extend to be directly connected to a gate driving circuit (not shown) for generating the gate signals, which may be integrated on the substrate 110.

The secondary gate line 122 is separated from the gate line 121 and extends substantially parallel to the gate line 121. The secondary gate line 122 includes the secondary control electrodes 124a and 124c located around the first control electrode 124b. The secondary control electrodes 124a and 124c include a first portion 124a located at both sides of the first control electrode 124b (hereinafter referred to as a "first secondary control electrode") and a second portion 124c (hereinafter referred to as a "second secondary control electrode"). Here, portions between the first secondary control electrode 124a and the first control electrode 124b, and between the first control electrode 124b and the second secondary control electrode 124c are offset regions, and the size thereof may be about 4 μm or smaller. If the size of the offset region is larger than 4 μm, then resistance may be increased to decrease an On current $I_{on}$.

The second control electrode 124d is separated from the gate line 121 and the secondary gate line 122. The second control electrode 124d includes a storage electrode 127 extending downward, turning to the right, and extending upward, as illustrated in FIG. 2.

In exemplary embodiments, the gate conductors 121, 122 and 124d are made of an Al-containing metal such as Al or an Al alloy, an Ag-containing metal such as Ag or an Ag alloy, a Cu-containing metal such as Cu or a Cu alloy, a Mo-containing metal such as Mo or a Mo alloy, Cr, Ta, Ti, etc. However, they may have a multi-layered structure including two films having different physical characteristics.

The lateral sides of the gate conductors 121, 122, and 124d are inclined relative to a surface of the substrate 110, and the inclination angle thereof is in a range of about 30 degrees to about 80 degrees.

A gate insulating layer 140 preferably made of silicon nitride ("SiNx") or silicon oxide ("SiOx") is formed on the gate conductors 121, 122 and 124d.

A plurality of first and second semiconductor islands 154 and 155, respectively, are formed on the gate insulating layer 140. The plurality of first and second semiconductor islands 154 and 155 may be made of a microcrystalline or polycrystalline semiconductor. Otherwise, one of the first semiconductor 154 and the second semiconductor islands 155 may be made of an amorphous semiconductor and the other may be made of a microcrystalline or polycrystalline semiconductor.

The first semiconductor island 154 is located on the first control electrode 124b and secondary control electrodes 124a and 124c, and the second semiconductor island 155 is located on the second control electrode 124d.

A plurality of pairs of ohmic contact islands 163a, 166, 167, 165c, 163d and 165d are formed on the first and second semiconductor islands 154 and 155.

The ohmic contact islands 163a, 166, 167 and 165c formed on the first semiconductor 154 include a first pair of ohmic contact islands 163a and 165a on the first secondary control electrode 124a, a second pair of ohmic contact islands 163b and 165b on the first control electrode 124b, and a third pair of ohmic contact islands 163c and 165c on the second secondary control electrode 124c. The ohmic contact islands 163d and 165d formed on the second semiconductor 155 are located in pairs on the second control electrode 124d to form a fourth pair of ohmic contacts 163d and 165d.

In exemplary embodiments, the ohmic contacts 163a, 166, 167, 165c, 163d and 165d are made of silicide or n+hydrogenated a-Si heavily doped with an n-type impurity such as phosphorous.

A plurality of data conductors, which include a plurality of data lines 171, a plurality of driving voltage lines 172, a plurality of first and second input and output electrodes 176 and 178, a plurality of third output electrodes 175c, and a plurality of fourth output electrodes 175d, are formed on the ohmic contacts 163a, 166, 167, 165c, 163d, and 165d and the gate insulating layer 140.

The data lines 171 transmit data signals, and extend substantially in the longitudinal direction, as illustrated in FIGS. 1 and 2, and intersect the gate lines 121 and the secondary gate lines 122. Each data line 171 includes a plurality of first input electrodes 173a extending toward the first control electrodes 124b, and an end portion 179 having a large area for contact with another layer or an external driving circuit (not shown).

The data lines 171 may extend to be directly connected to a data driving circuit (not shown) for generating the data signals, which may be integrated on the substrate 110.

Figure 3:
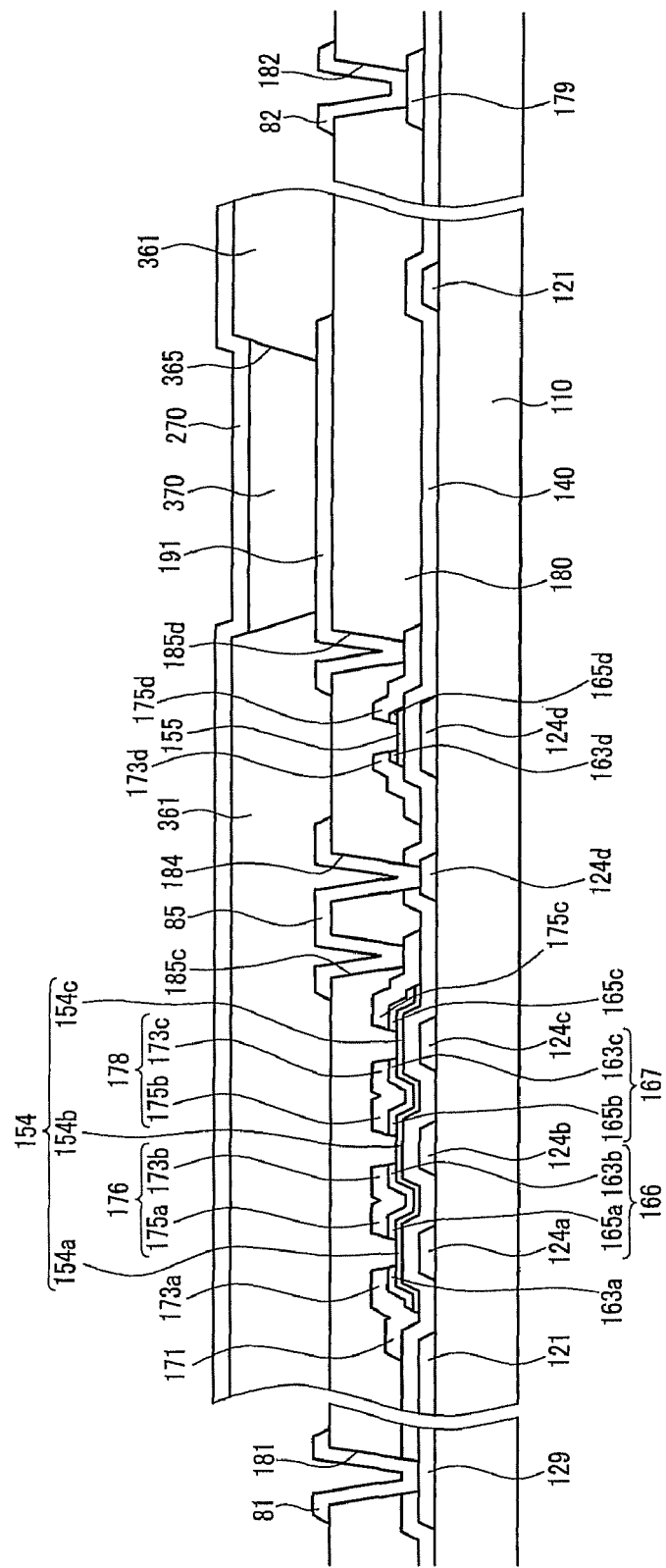
FIG. 3 is a cross-sectional view of the OLED display shown in FIG. 2 taken along line III-III.

With reference to FIGS. 2 and 3, the first input and output electrode 176 includes a first portion 175a (hereinafter referred to as a "first output electrode") located opposite the first input electrode 173a with respect to the first secondary control electrode 124a and a second portion 173b (hereinafter referred to as a "second input electrode") partially overlapping the first control electrode 124b.

The second input and output electrode 178 includes a first portion 175b (hereinafter referred to as a "second output electrode") located opposite the second input electrode 173b with respect to the first control electrode 124b and a second portion 173c (hereinafter referred to as a "third input electrode") partially overlapping the second secondary control electrode 124c.

The third output electrode 175c is located opposite the third input electrode 173c with respect to the second secondary control electrode 124c.

The first input electrode 173a, the first input and output electrode 176, the second input and output electrode 178, and the third output electrode 175c are separated from each other. The first input electrode 173a, the first input and output electrode 176, the second input and output electrode 178, and the third output electrode 175c partially overlap the first semiconductor island 154, and the first semiconductor island 154 includes a first portion 154a located between the first input electrode 173a and the first input and output electrode 176, a second portion 154b located between the first input and output electrode 176 and the second input and output electrode 178, and a third portion 154c located between the second input and output electrode 178 and the third output electrode 175c.

The driving voltage lines 172 transmit driving voltages, and extend substantially in the longitudinal direction, as illustrated in FIGS. 1 and 2, and intersect the gate lines 121 and the secondary gate lines 122. Each driving voltage line 172 includes a plurality of fourth input electrodes 173d extending toward the second control electrode 124d. The driving voltage line 172 overlaps the storage electrode 127.

The fourth output electrode 175d is separated from the data line 171, the first input and output electrode 176, the second input and output electrode 178, the third output electrode 175c, and the driving voltage line 172. The fourth output electrode 175d is located opposite the fourth input electrode 173d on the second semiconductor island 155, as best seen with reference to FIG. 2.

In exemplary embodiments, the data conductors 171, 176, 178, 175c, 172 and 175d may be made of any refractory metal including Mo, Cr, Ta, Ti, or alloys thereof. They may have a multilayered structure preferably including a refractory metal film and a low resistivity film.

Like the gate conductors 121, 122 and 124b, the data conductors 171, 172, 175c, 175d, 176 and 178 have inclined edge profiles relative to the surface of the substrate 110, and the inclination angles thereof are in a range of about 30 degrees to about 80 degrees.

A passivation layer 180 is formed on the data conductors 171, 172, 175c, 175d, 176, 178, the exposed portions of the semiconductors 154 and 155, and the gate insulating layer 140.

In exemplary embodiments, the passivation layer 180 is made of an inorganic insulator such as silicon nitride and silicon oxide, or an organic insulator such as a polyacryl compound, and may have a flat surface. The passivation layer 180 may include a lower film of an inorganic insulator and an upper film of an organic insulator.

The passivation layer 180 has a plurality of contact holes 182 exposing the end portions 179 of the data lines 171, and the passivation layer 180 and the gate insulating layer 140 have a plurality of contact holes 181 exposing the end portions 129 of the gate lines 121. Also, the passivation layer 180 has a plurality of contact holes 185c and 185d exposing the third output electrodes 175c and the fourth output electrodes 175d, respectively. The passivation layer 180 and the gate insulating layer 140 have a plurality of contact holes 184 exposing the second control electrodes 124d.

A plurality of pixel electrodes 191, a plurality of connecting members 85, and a plurality of contact assistants 81 and 82 are formed on the passivation layer 180.

The pixel electrodes 191 are electrically connected to the fourth output electrodes 175d through the contact holes 185d.

The connecting members 85 are connected to the third output electrodes 175c and the second control electrodes 124d through the contact holes 185c and 184, respectively.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 from damage and complement the adhesion between the end portions 129 and 179 and external devices (not shown).

The pixel electrodes 191, the connecting members 85 and the contact assistants 81 and 82 may be made of a transparent conductor such as indium tin oxide ("ITO") or indium zinc oxide ("IZO"), and they may be made of an opaque conductor such as Al or an alloy thereof, or Au, Pt, Ni, Cu, or W having a large work function or an alloy thereof in a top emission type display.

A partition 361 is formed on the pixel electrodes 191, the connecting members 85 and the passivation layer 180. The partition 361 surrounds the pixel electrodes 191 like a bank to define openings 365. The partition 361 may be made of an organic insulator, such as acrylic resin and polyimide resin, having heat-resistant and dissolvent properties, or an inorganic insulator, such as silicon dioxide ("SiO$_2$") or titanium dioxide ("TiO$_2$"), and may have a multi-layered structure. The partition 361 may be made of a photosensitive material containing black pigment so that the black partition 361 may serve as a light blocking member and the formation of the partition 361 may be simplified.

A plurality of light emitting members 370 are formed on the pixel electrodes 191 and confined in the openings 365 defined by the partition 361.

Each of the light emitting members 370 may have a multi-layered structure including an emitting layer (not shown) for emitting light and auxiliary layers (not shown) for improving the efficiency of light emission of the emitting layer.

In exemplary embodiments, each of the light emitting members 370 is made of an organic material uniquely emitting one of primary color lights such as red, green and blue light, for example, but not limited thereto, or a mixture of an organic material and an inorganic material, and may include a high molecular substance such as a polyfluorene derivative, a (poly)paraphenylenevinylene derivative, a polyphenylene derivative, a polyfluorene derivative, polyvinylcarbazole, a polythiophene derivative, or a compound doping an above high molecular substance with a perylene group pigment, a cumarine group pigment, a rhodamine group pigment, rubrene, perylene, 9,10-diphenylanthracene, tetraphenylbutadiene, Nile red, coumarin, quinacridone, for example, but not limited thereto.

The OLED display displays images by spatially adding the monochromatic primary color lights emitted from the light emitting members 370.

The auxiliary layers may include an electron transport layer (not shown) and a hole transport layer (not shown) for improving the balance of electrons and holes and an electron injecting layer (not shown) and a hole injecting layer (not shown) for improving the injection of the electrons and holes. The hole transport layer and the hole injecting layer may be made of a material having a work function which lies between that of the pixel electrodes 191 and that of the emission layer, and the electron transport layer and the electron injecting layer may be made of a material having a work function which lies between that of a common electrode 270 and that of the emission layer. For example, the hole transport layer and the hole injecting layer may be made of a compound such as poly-(3,4-ethylenedioxythiophene: polystyrenesulfonate ("PEDOT:PSS").

The common electrode 270 is formed on the light emitting members and the partition 361. The common electrode 270 is formed on the entire substrate 110, and supplies currents to the light emitting members 370 in cooperation with the pixel electrodes 191.

As described above, the OLED display according to an exemplary embodiment of the present invention includes the first, the second and the third switching TFTs Qs1, Qs2 and Qs3, and the driving TFTs Qd.

The first secondary control electrode 124a connected to the secondary gate line 122, the first input electrode 173a connected to the data line 171, and the first output electrode 175a along with the first portion 154a of the first semiconductor 154 form the first switching TFT Qs1 having a channel formed in the first portion 154a of the first semiconductor 154 located between the first input electrode 173a and the first output electrode 175a.

Likewise, the first control electrode 124b connected to the gate line 121, the second input electrode 173b, and the second output electrode 175b along with the second portion 154b of the first semiconductor 154 form the second switching TFT Qs2 having a channel formed in the second portion 154b of the first semiconductor 154 located between the second input electrode 173b and the second output electrode 175b.

Also, the second secondary control electrode 124c, the third input electrode 173c, and the third output electrode 175c along with the third portion 154c of the first semiconductor 154 form the third switching TFT Qs3 having a channel formed in the third portion 154c of the first semiconductor 154 located between the third input electrode 173c and the third output electrode 175c.

Likewise, the second control electrode 124d connected to the third output electrode 175c, the fourth input electrode 173d connected to the driving voltage line 172, and the fourth output electrode 175d connected to the pixel electrode 191 along with the second semiconductor 155 form the driving TFT Qd having a channel formed in the second semiconductor 155 located between the fourth input electrode 173d and the fourth output electrode 175d.

As described above, the OLED display according to the present exemplary embodiment includes a plurality of switching TFTs Qs1, Qs2 and Qs3.

The second switching TFT Qs2 of the switching TFTs Qs1, Qs2 and Qs3 is a main switching TFT which transmits the data signals applied to the data line 171 to the driving transistor Qd in response to the gate signals applied to the gate line 121.

The first and third switching TFTs Qs1 and Qs3 located at both sides of the second switching TFT Qs2, respectively, are secondary switching TFTs for reducing a leakage current when a gate-off voltage is supplied.

In more detail, when the gate-on voltage is supplied, the gate line 121 is supplied with a positive voltage and the secondary gate line 122 is also supplied with a positive voltage. Here, the data signal applied to the data line 171 is transmitted to the driving TFT Qd through the first, second and third switching TFTs Qs1, Qs2 and Qs3.

When the gate-off voltage is supplied, the gate line 121 is supplied with a negative voltage and the secondary gate line 122 is supplied with a positive voltage. Here, the channel of the first and third switching TFTs Qs1 and Qs3 supplied with the positive voltage is an n-type channel where electrons are accumulated, while the channel of the second switching TFT Qs2 is a p-type channel where holes are accumulated.

The switching TFT of the OLED display according to an exemplary embodiment of the present invention includes the p-type second switching TFT Qs2, the n-type first and third switching TFTs Qs1 and Qs3 located at both sides of the second switching TFT Qs2. Accordingly, there are high electric potential differences between the first switching TFT Qs1 and the second switching TFT Qs2, and between the second switching TFT Qs2 and the third switching TFT Qs3 to form barriers which block an electric charge from flowing.

The barriers formed by the electric potential differences reduce leakage current such that the barriers prevent carriers from moving while supplying the gate-off voltage.

Although the secondary gate line 122 supplied with a positive voltage while supplying the gate-off voltage is described in the above exemplary embodiment of the present invention, a floating secondary gate line 122 may alternatively be applied.

The OLED display according to an exemplary embodiment of the present invention may include other TFTs and wiring for driving them to prevent the OLED LD and the driving TFT Qd from degrading and prevent the lifetime of the OLED display from shortening in addition to the switching TFTs and the driving TFTs described in the above exemplary embodiment.

A pixel electrode 191, a light emitting member 370 and the common electrode 270 form an OLED LD having the pixel electrode 191 as an anode and the common electrode 270 as a cathode, or vice versa. The overlapping portions of the storage electrode 127 and the driving voltage line 172 form a storage capacitor Cst.

Now, a manufacturing method of the OLED shown in FIGS. 2 and 3 is described with reference to FIGS. 4 to 13 along with FIGS. 2 and 3.

FIG. 4, FIG. 6, FIG. 8, FIG. 10, and FIG. 12 are plan view layouts of the OLED display shown in FIGS. 2 and 3 in intermediate steps of a manufacturing method thereof according to an exemplary embodiment of the present invention. FIG. 5 is a cross-sectional view of the OLED display shown in FIG. 4 taken along V-V, FIG. 7 is a cross-sectional view of the OLED display shown in FIG. 6 taken along VII-VII, FIG. 9 is a cross-sectional view of the OLED display shown in FIG. 8 taken along line IX-IX, FIG. 11 is a cross-sectional view of the OLED display shown in FIG. 10 taken along line XI-XI, and FIG. 13 is a cross-sectional view of the OLED display shown in FIG. 12 taken along line XIII-XIII.

Figure 4:
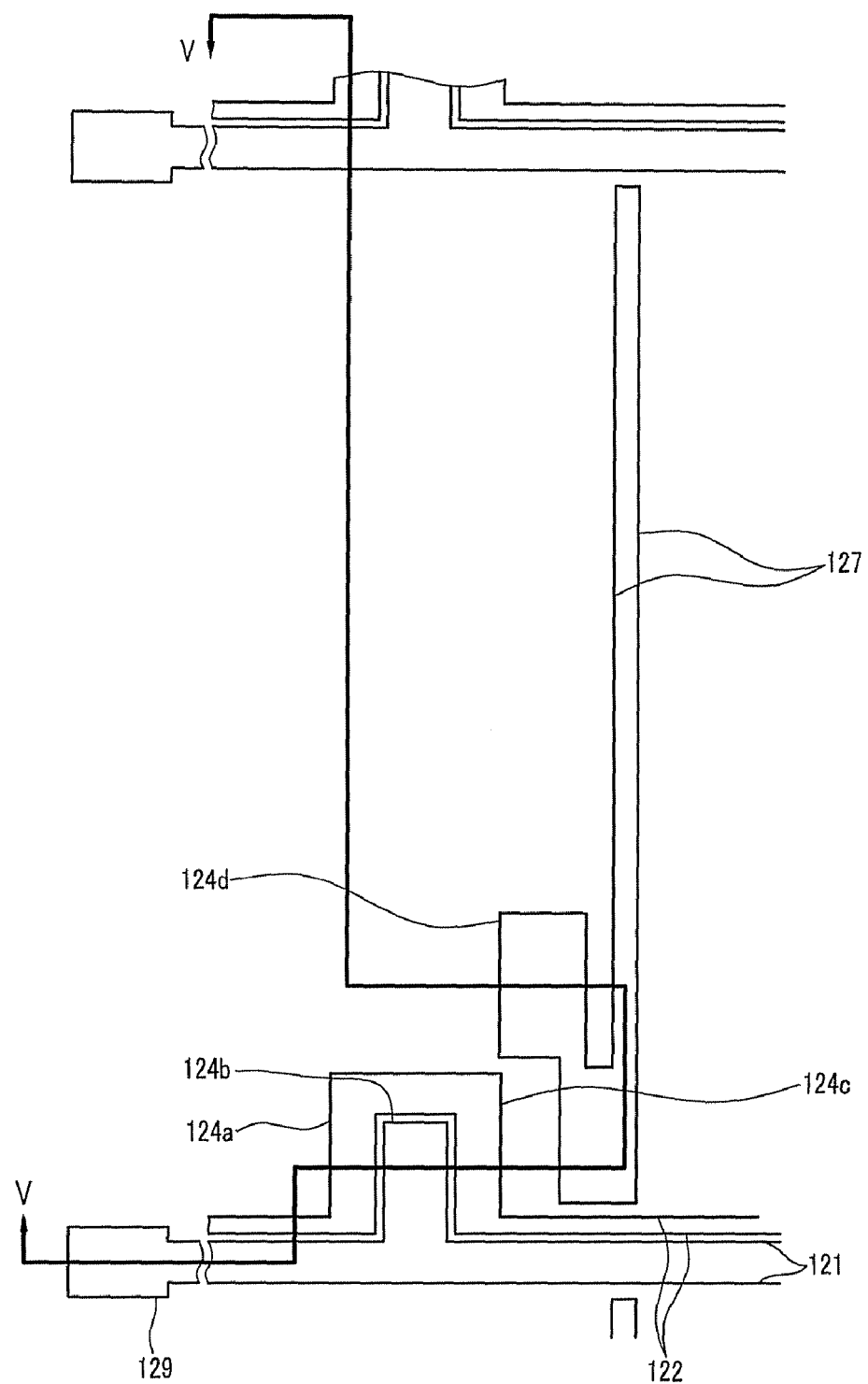
FIG. 4, FIG. 6, FIG. 8, FIG. 10 and FIG. 12 are plan view layouts of the OLED display shown in FIGS. 2 and 3 in intermediate steps of a manufacturing method thereof according to an exemplary embodiment of the present invention.
Figure 5:
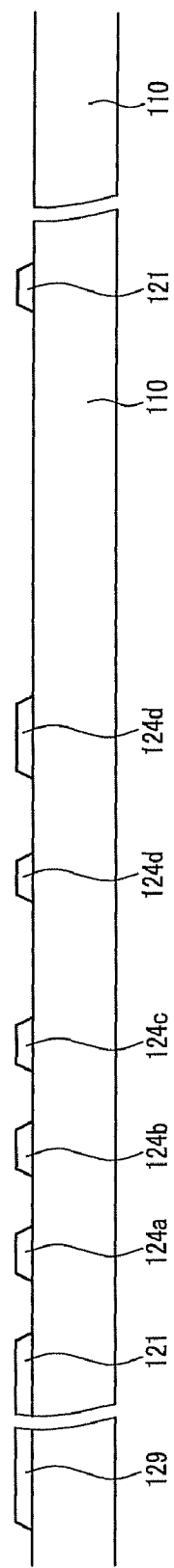
FIG. 5 is a cross-sectional view of the OLED display shown in FIG. 4 taken along line V-V.

As shown in FIGS. 4 and 5, a plurality of gate lines 121 including a plurality of switching control electrodes 124b and a plurality of end portions 129, a plurality of secondary gate lines 122 including a plurality of secondary gate lines 124a and 124c, and a plurality of second control electrodes 124d (only one shown) including a plurality of storage electrodes 127 (only one shown) are formed on an insulating substrate 110 made of a material such as transparent glass or plastic.

Figure 6:
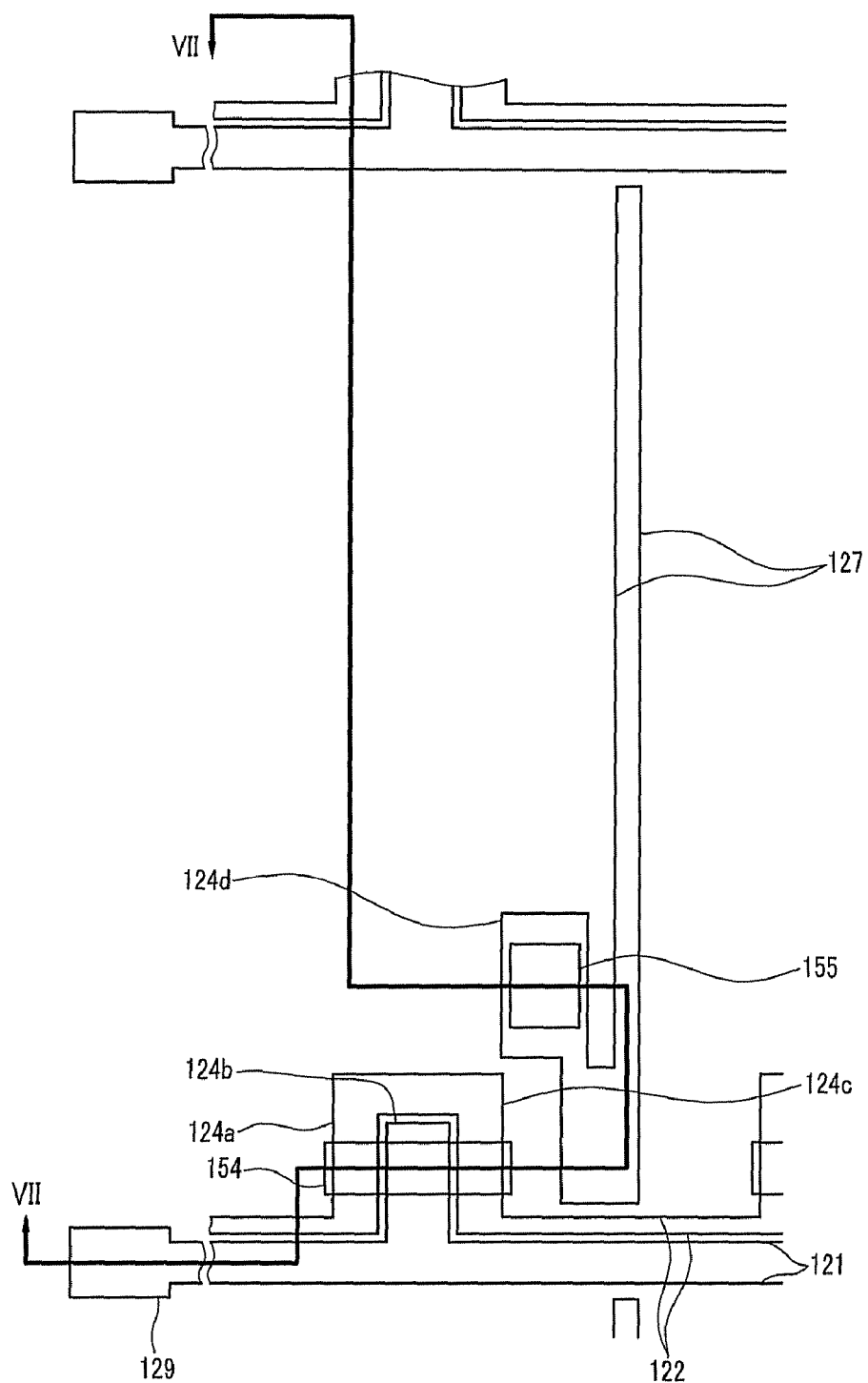
Figure 7:
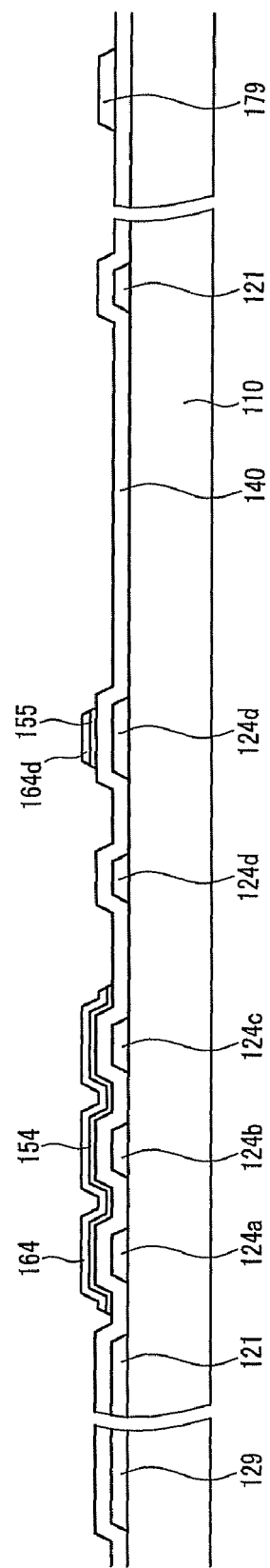
FIG. 7 is a cross-sectional view of the OLED display shown in FIG. 6 taken along line VII-VII.

Referring to FIGS. 6 and 7, after sequential deposition of a gate insulating layer 140, an intrinsic a-Si layer, and an extrinsic a-Si layer on the substrate 110 having the gate lines 121, the secondary gate lines 122, and second control electrodes 124d by plasma enhanced chemical vapor deposition ("PECVD"), for example, but is not limited thereto, the extrinsic a-Si layer and the intrinsic a-Si layer are patterned by lithography and etched to form a plurality of extrinsic semiconductor layers 164 and 164d and a plurality of first and second semiconductor islands 154 and 155.

Thereafter, the first and second semiconductor islands 154 and 155, and the extrinsic semiconductor layers 164 and 164d are crystallized. Here, the crystallization may be performed by solid phase crystallization ("SPC"), excimer laser annealing ("ELA"), metal induced lateral crystallization ("MILC"), for example, but is not limited thereto. In exemplary embodiments, however, the SPC is used.

The crystallization may be performed after forming the first and second semiconductor islands 154 and 155 and before forming the extrinsic semiconductor layers 164 and 164d, and may be performed after deposition of the intrinsic a-Si layer and an extrinsic a-Si layer, but before patterning, to form the first and second semiconductor islands 154 and 155 and the extrinsic semiconductor layers 164 and 164d.

Otherwise, one of the first and second semiconductor islands 154 and 155 may be crystallized, and the other may remain in an amorphous state.

Figure 8:
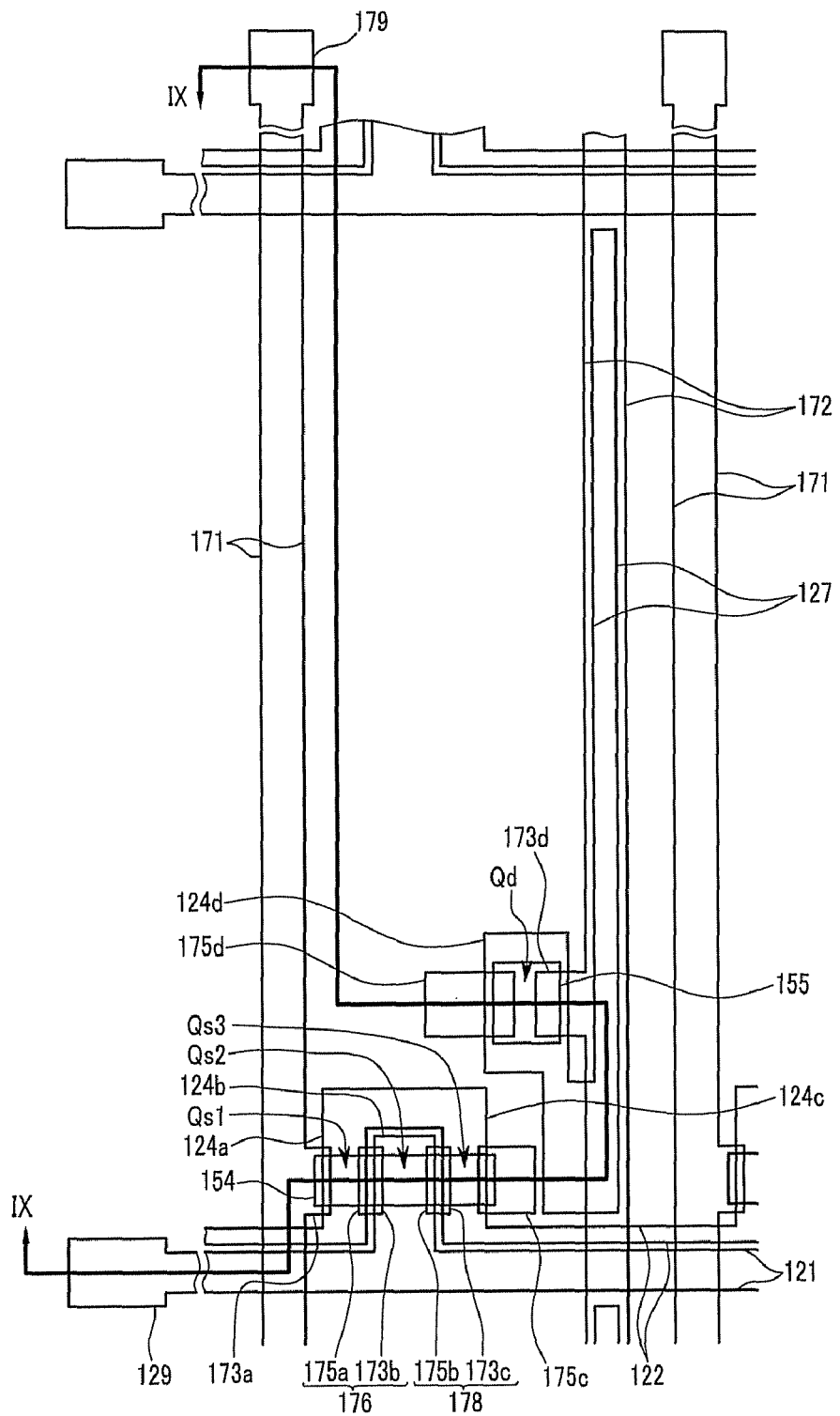
Figure 9:
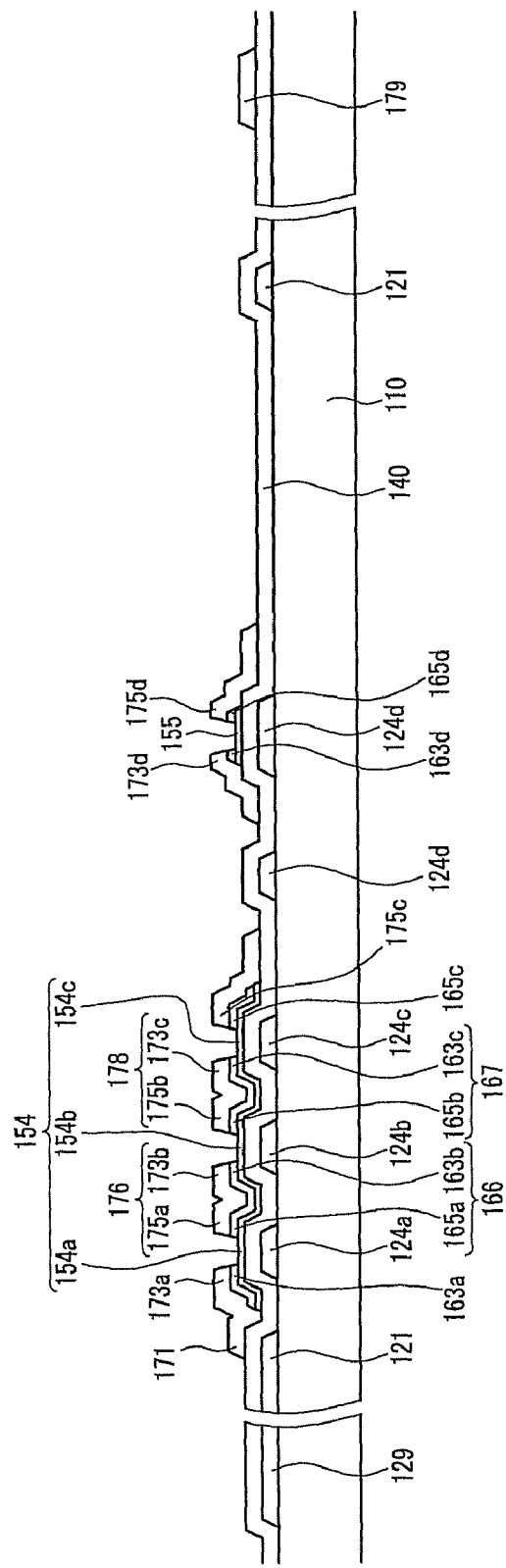
FIG. 9 is a cross-sectional view of the OLED display shown in FIG. 8 taken along the line IX-IX.

As shown in FIGS. 8 and 9, data conductors, which include a plurality of data lines 171 including first input electrodes 173a and end portions 179, a plurality of first and second input and output electrodes 176 and 178, a plurality of third output electrodes 175c, a plurality of driving voltage lines 172 including fourth input electrodes 173d, a plurality of first and second output electrodes 175a and 175b, and a plurality of fourth output electrodes 175d are formed on the extrinsic semiconductor layers 164 and 164d and the gate insulating layer 140. Here, the data lines 171, the first and the second input and output electrodes 176 and 178, and the third output electrodes 175c partially overlap the first semiconductor islands 154, and the fourth input electrodes 173d and the fourth output electrodes 175d partially overlap the second semiconductor islands 155.

Thereafter, portions of the extrinsic semiconductors 164 and 164d, which are not covered with the first input electrodes 173a, the first and second input and output electrodes 176 and 178, the third output electrodes 175c, and the fourth input electrodes 173d, are removed by etching to complete a plurality of ohmic contacts 163a, 166, 167, 165c, 163d and 165d and to expose portions of the underlying first and second semiconductor islands 154 and 155.

Figure 10:
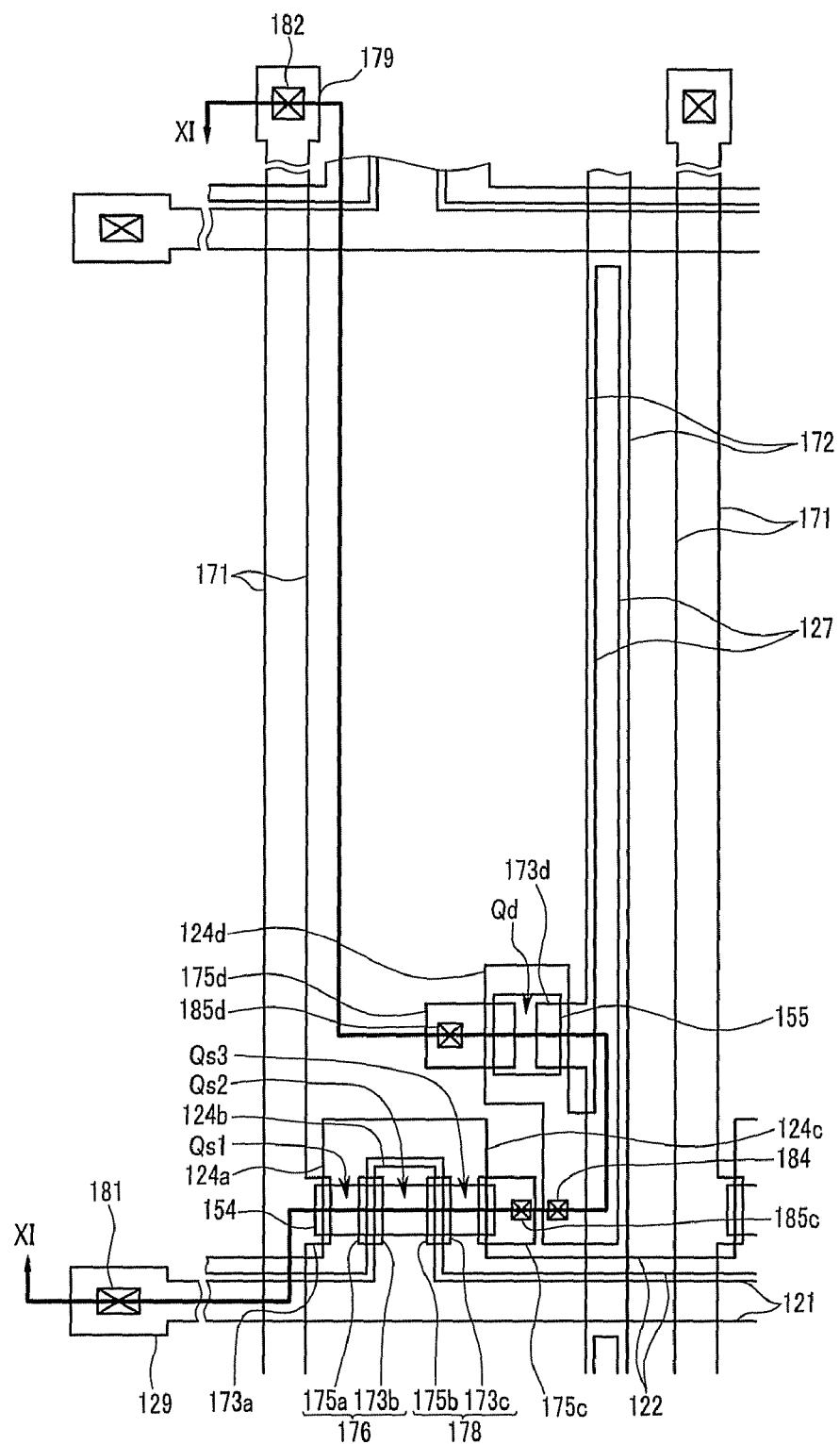
Figure 11:
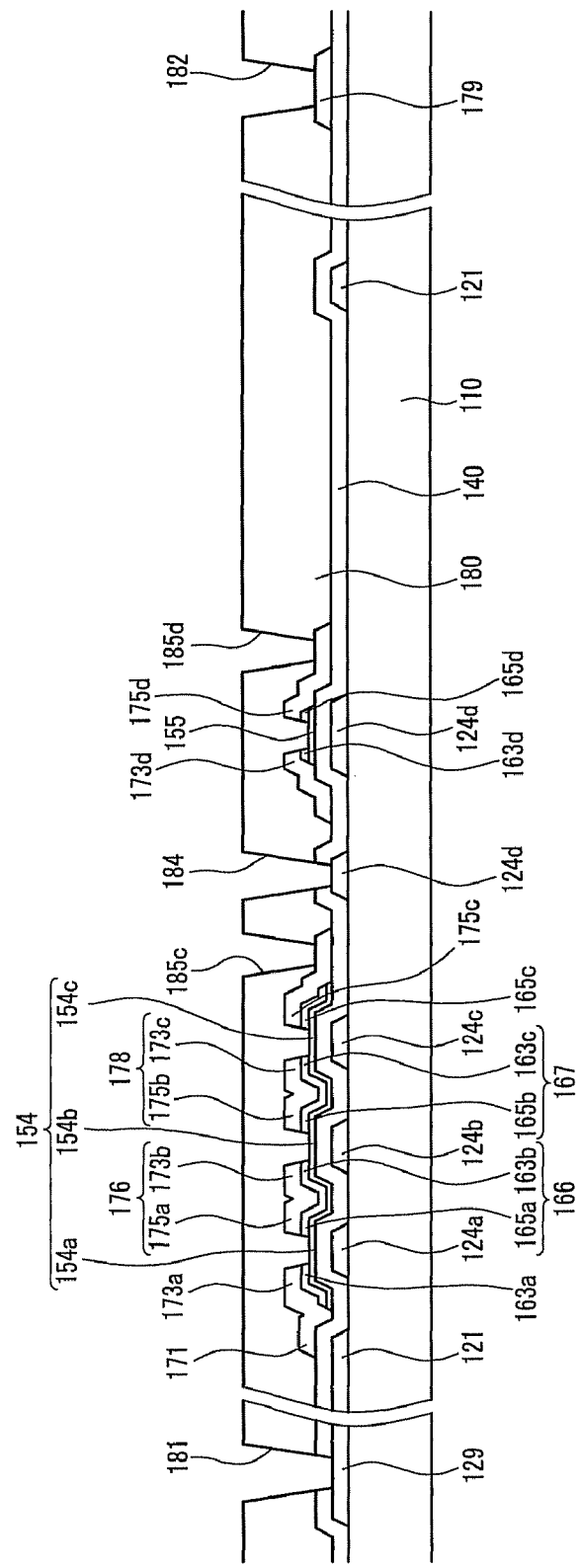
FIG. 11 is a sectional view of the OLED display shown in FIG. 10 taken along line XI-XI.

Referring to FIGS. 10 and 11, a passivation layer 180 is deposited and patterned by photolithography (and etching) along with the gate insulating layer 140 to form a plurality of contact holes 181, 182, 184, 185c and 185d exposing the end portions 129 of the gate lines 121, the end portions 179 of the data lines 171, the third output electrodes 175c, the second control electrodes 124d, and the fourth output electrodes 175d, respectively.

Figure 12:
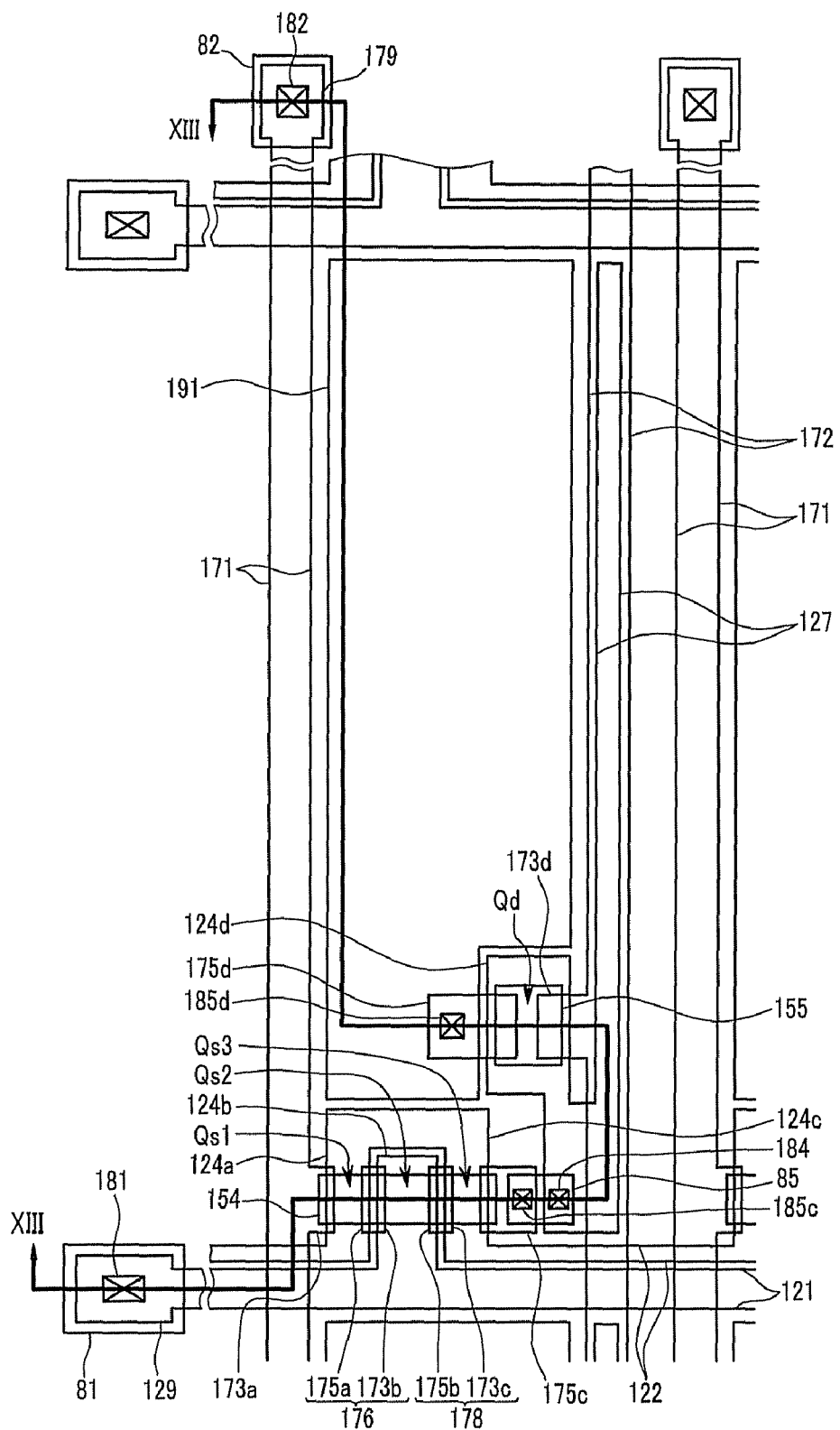
Figure 13:
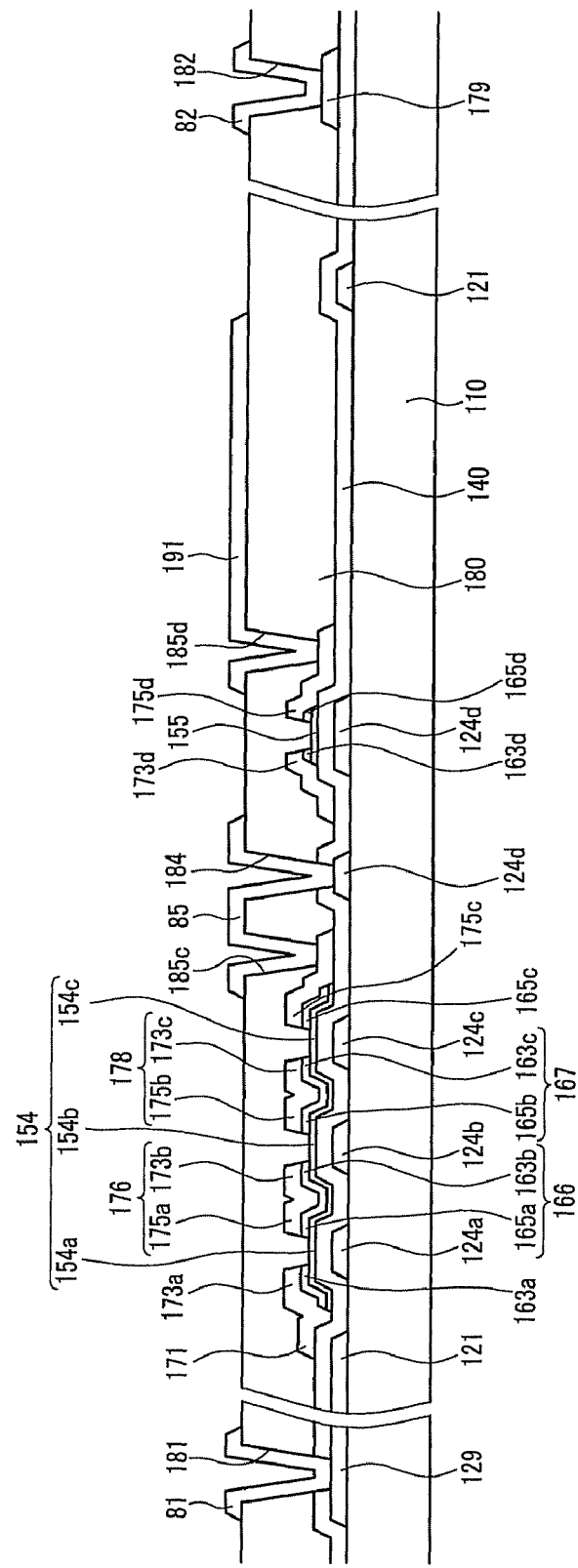
FIG. 13 is a cross-sectional view of the OLED display shown in FIG. 12 taken along line XIII-XIII.

A plurality of pixel electrodes 191, a plurality of connecting members 85, and a plurality of contact assistants 81 and 82 are formed on the passivation layer 180 as shown in FIGS. 12 and 13.

Referring to FIGS. 2 and 3, a photosensitive organic insulator is deposited by spin coating, and is exposed and developed to form partition 361 having openings 365.

Thereafter, light emitting members 370 including a hole transport layer (not shown) and an emission layer (not shown) are formed in the openings 365 disposed on the pixel electrode 191. The organic light emitting members 370 may be formed by a solution process, such as by inkjet printing and evaporation. The inkjet printing may be preferably used in exemplary embodiments.

Thereafter, a common electrode 270 is formed on the partition 361 and the light emitting members 370.

In the OLED display according to an exemplary embodiment of the present invention, different voltages are supplied to the main switching TFTs and the secondary switching TFTs while supplying the gate-off voltage such that an electric charge flow is blocked to reduce leakage current and improve characteristics of the OLED display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
    a substrate;
    a gate line formed on the substrate and including a first control electrode;
    a secondary gate line substantially parallel to the gate line and including a secondary control electrode;
    a data line intersecting the gate line;
    a switching TFT connected to the gate line and the data line and having a first channel portion, a second channel portion, and a third channel portion;
    a driving TFT connected to the switching TFT;
    a first electrode connected to the driving TFT;
    a second electrode opposite the first electrode; and
    a light emitting member formed between the first electrode and the second electrode, wherein the first channel portion and the third channel portion are disposed on the secondary control electrode and the second channel portion is disposed on the first control electrode.

2. The organic light emitting diode display of claim 1, wherein the switching TFT includes a polycrystalline semiconductor.

3. The organic light emitting diode display of claim 1, wherein the driving TFT includes a polycrystalline semiconductor.

4. The organic light emitting diode display of claim 1, wherein the secondary gate line is supplied with a voltage different from that of the gate line.

5. The organic light emitting diode display of claim 4, wherein the secondary gate line is supplied with a positive voltage when the gate line is supplied with a gate-off voltage.

6. The organic light emitting diode display of claim 4, wherein the secondary gate line is floating when the gate line is supplied with a gate-off voltage.

7. The organic light emitting diode display of claim 1, wherein the secondary control electrode includes a first secondary control electrode and a second secondary control electrode, and the first control electrode is located between the first secondary control electrode and the second secondary control electrode.

8. The organic light emitting diode display of claim 7, wherein each interval between the first control electrode, and the first secondary control electrode and the second secondary control electrode, is about 4 μm or less.

9. The organic light emitting diode display of claim 7, wherein the plurality of channels include a first channel formed on the first secondary control electrode, a second channel formed on the first control electrode and a third channel formed on the second secondary control electrode.

10. The organic light emitting diode display of claim 9, wherein the first, second and third channels are formed on a polycrystalline semiconductor.

11. The organic light emitting diode display of claim 7, wherein the switching TFT comprises:
    a first switching TFT including the first secondary control electrode, a first input electrode connected to the data line, and a first output electrode opposite the first input electrode;
    a second switching TFT including the first control electrode, a second input electrode connected to the first output electrode, and a second output electrode opposite the second input electrode; and
    a third switching TFT including the second secondary control electrode, a third input electrode connected to the second output electrode, and a third output electrode opposite the third input electrode.

12. The organic light emitting diode display of claim 11, wherein the first switching TFT, the second switching TFT and the third switching TFT include a polycrystalline semiconductor.

13. The organic light emitting diode display of claim 1,
    wherein the secondary control electrode includes a first secondary control electrode and a second secondary control electrode,
    wherein the switching TFT comprises a first semiconductor formed on the first control electrode and the secondary control electrode;
    a first input electrode connected to the data line, and partially overlapping the first semiconductor;
    a first input and output electrode partially overlapping the first secondary control electrode and the first control electrode, and including a portion opposite the first input electrode;
    a second input and output electrode partially overlapping the second secondary control electrode, and including a portion opposite the first input and output electrode; and
    a first output electrode partially overlapping the second secondary control electrode, and including a portion opposite the second input and output electrode; and
    wherein the driving TFT comprises a second control electrode connected to the first output electrode;
    a second semiconductor formed on the second control electrode; and
    a second input electrode and a second output electrode partially overlapping the second semiconductor.

14. The organic light emitting diode display of claim 13, wherein the secondary control electrode surrounds the first control electrode, and the first control electrode is located between the first secondary control electrode and the second secondary control electrode.

15. The organic light emitting diode display of claim 14, wherein the secondary control electrode and the first control electrode are separated from each other by an interval of about 4 μm.

16. The organic light emitting diode display of claim 13, wherein the first input electrode, the first input and output electrode, the second input and output electrode and the first output electrode are connected to each other by the first semiconductor.

17. The organic light emitting diode display of claim 13, wherein the first semiconductor and the second semiconductor include a polycrystalline semiconductor.

18. The organic light emitting diode display of claim 13, wherein the secondary gate line is supplied with a voltage different from that of the gate line.

19. The organic light emitting diode display of claim 18, wherein the secondary gate line is supplied with a positive voltage when the gate line is supplied with a gate-off voltage.

20. The organic light emitting diode display of claim 18, wherein the secondary gate line is floating when the gate line is supplied with a gate-off voltage.

* * * * *